United States Patent [19]
Garofalo et al.

[11] Patent Number: 5,338,626
[45] Date of Patent: Aug. 16, 1994

[54] FABRICATION OF PHASE-SHIFTING LITHOGRAPHIC MASKS

[75] Inventors: Joseph G. Garofalo, South Orange, N.J.; Robert L. Kostelak, Jr., Morris Plains; Christophe Pierrat; Sheila Vaidya, both of Watchung, all of N.J.

[73] Assignee: AT&T Bell Laboratories, Murray Hill, N.J.

[21] Appl. No.: 982,270

[22] Filed: Nov. 25, 1992

Related U.S. Application Data

[63] Continuation-in-part of Ser. No. 797,495, Nov. 22, 1991, abandoned.

[51] Int. Cl.$^5$ ................................................ G03F 9/00
[52] U.S. Cl. ........................................ 430/5; 430/312; 250/492.3
[58] Field of Search ............... 430/5, 290, 296, 311, 430/312, 321; 250/492.2, 492.3, 398

[56] References Cited

U.S. PATENT DOCUMENTS

| | | | |
|---|---|---|---|
| 4,948,706 | 8/1990 | Sugihara et al. | 430/311 |
| 5,126,220 | 6/1992 | Tokitomo et al. | 430/5 |

FOREIGN PATENT DOCUMENTS 0290670 11/1987 Fed. Rep. of Germany.

OTHER PUBLICATIONS

W. D. Hinsberg, et al., "A Lithographic Analog of Color Photography: Self-Aligning Photolithography Using a Resist with Wavelength-Dependent Tone", *J. of Imaging Science*, vol. 33, No. 4 (1989).

Pfau, A. K. et al., *Proc. SPIE*, Optical/Laser Microlithography II (1991), pp. 124–134.

*Primary Examiner*—Steve Rosasco
*Attorney, Agent, or Firm*—David I. Caplan

[57] ABSTRACT

A phase-shifting lithographic mask is fabricated, in one embodiment, by using a resist layer that is negative tone with respect to a (patterned) electron beam and is positive tone with respect to a (flood) mid-ultraviolet beam, with the tone of the electron beam predominating over that of the mid-ultraviolet beam. The resist layer is spun on a body comprising a patterned metallic layer located on a (transparent) quartz slab. The body is subjected from below to a flood mid-ultraviolet beam and from above to a patterned electron beam whose edges are located somewhere in the midst of the patterned opaque layer but are not coincident with any edges of the patterned opaque layer. Thus, a subsequent development of the resist layer removes those regions and only those regions of the resist layer upon which the ultraviolet beam was incident—i.e., not in the shadows cast by the patterned opaque layer—in the absence of incidence of the patterned electron beam. Then, an anisotropic etching removes to a prescribed depth the portions of the (transparent) substrate not covered by the remaining (patterned) resist layer. In other embodiments, the (patterned) electron beam is replaced by a (patterned) deep ultraviolet beam. In still other embodiments the same radiation (wavelength) can be used for the patterned beam as for the flood radiation in conjunction with a resist layer whose tone can be reversed by an intermediate processing step between irradiations with the patterned and flood beams, respectively.

13 Claims, 2 Drawing Sheets

FABRICATION OF PHASE-SHIFTING LITHOGRAPHIC MASKS

This application is a continuation-in-part of application Ser. No. 07/797,495, filed on Nov. 22, 1991, now abandoned.

TECHNICAL FIELD

This invention relates to optical lithography, such as used for the fabrication of semiconductor integrated circuit and other devices, and more particularly to methods for making phase-shifting masks, for use in optical systems for lithographically fabricating such devices. These masks are also called "reticles" particularly when used in optical systems having magnifications different from unity.

BACKGROUND OF THE INVENTION

FIG. 1 shows a typical optical lithographic system 200 for delineating features in a wafer (substrate) 100 or in one or more layers of material(s) (not shown) located on a top major surface of the wafer, typically a semiconductor wafer (substrate). More specifically, optical radiation from an optical source 106, such as a mercury lamp, propagates through an aperture in an opaque screen 105, an optical collimating lens 104, a mask or reticle 103, and an optical focusing lens 102. The optical radiation emanating from the reticle 103 is focused by the lens 102 onto a photoresist layer 101 located on the top major surface of the wafer 100 itself or, alternatively, on the layer(s) on the top surface of the wafer 100. Thus, the pattern of the reticle 103—that is, its pattern of transparent and opaque portions—is focused on the photoresist layer 101. Depending upon whether this photoresist is positive or negative, when it is subjected to a developing process, typically a wet developer, the material of the photoresist is removed or remains at and only at areas where the optical radiation was incident. Thus, the pattern of the mask is transferred to ("printed on") the photoresist layer 101. Subsequent etching processes, such as wet etching or dry plasma etching, remove selected portions of the substrate or of the layer(s) of material(s) (not shown) located between the top major surface of the wafer and the bottom surface of the photoresist layer, or of both the substrate and the layer(s). Portions of the substrate or of the layer(s) of material thus are removed from the top surface of the wafer 100 at areas underlying where the photoresist layer 101 was removed by the developing process but not at areas underlying where the photoresist remains. Thus, the pattern of the mask 103 is transferred to the wafer 100 or to the layer(s) of material(s) overlying the wafer 100, as is desired, for example, in the art of semiconductor integrated circuit fabrication.

In fabricating such circuits, it is desirable to have as many devices, such as transistors, per wafer. Hence it is desirable to have as small a transistor or other feature size as possible, such as the feature size of a metallization stripe—i.e., its width W—or of an aperture in an insulating layer which is to be filled with metal, in order to form electrical connections, for example, between one level of metallization another. Thus, for example, if it is desired to print the corresponding isolated feature having a width equal to W on the photoresist layer 101, a feature having a width equal to C must be located on the mask (reticle) 103. According to geometric optics, if this feature of width equal to C is a simple aperture in an opaque layer, then the ratio W/C=m, where m=L2/L1, and where m is known as the lateral magnification. When diffraction effects become important, however, the edges of the image become fuzzy (lose their sharpness); hence the resolution of the mask features when focused on the photoresist layer deteriorates.

In a paper entitled "Exploration of Fabrication Techniques for Phase-Shifting Masks" published in *Proc. SPIE.* (The Society of Photo-Optical Instrumentation Engineers)—The International Society for Optical Engineering—Optical/Laser Microlithography IV, Vol. 1463, pp. 124–134 (March, 1991), A. K. Pfau et al. taught the use of masks having transparent phase-shifting portions in an effort to achieve improved resolution—i.e., improved sharpness of the image of the mask features focused on the photoresist layer 101. More specifically, these masks contained suitably patterned transparent optical phase-shifting layers, i.e., layers having edges located at predetermined distances from the edges of the opaque portions of the mask. Each of these phase-shifting layers had a thickness t equal to $\lambda/2(n-1)$, where $\lambda$ is the wavelength of the optical radiation from the source 106 (FIG. 1) and $\underline{n}$ is the refractive index of the phase-shifting layers. Thus, as known in the art, these layers introduced phase shifts (delays) of $\pi$ radians in the optical radiation. By virtue of diffraction principles, the presence of these phase-shifting layers should produce the desired improved resolution. Such masks are called "phase-shifting" masks.

The mask structure described by A. K. Pfau et al., op. cit., was manufactured by a single-alignment-level process involving forming a chromium layer on a top major surface of a quartz substrate, followed by patterning the chromium layer into segments by means of lithographic masking and etching. Next, a positive resist layer was formed over the resulting structure. The resist layer was bombarded with a patterned beam of actinic radiation having edges located somewhere on every other chromium segment. Then a dry plasma anisotropic etching is performed, using the combination of the patterned resist layer and the patterned chrome layer as a protective mask against the etching, whereby the desired phase-shifting mask structure was obtained (after removal of the patterned resist layer). No (precise) alignments were thus required. However, in such a case, when the dry plasma etching is performed, the then exposed edge regions of the chrome layer may undesirably be removed or chemically changed, whereby the reflectivity of the resulting chrome layer is not desirably uniform across the surface of the chrome; so that, when the resulting lithographic mask is used in an optical lithography system, undesirable optical noise can result. Also, in such a case, during the dry etching of the substrate the width of remaining patterned chrome layer undesirably can be changed, whereby line-width control is undesirably lost; and moreover (nonvolatile) chromium fluoride can deposit on the (quartz) substrate, whereby its optical transmission is undesirably reduced when the resulting phase-shifting mask (of which the substrate is a part) is used for optical lithography.

Therefore, it would be desirable to have a method of manufacturing phase-shifting masks that requires no (precise) alignment level and that ameliorates the shortcomings of prior art.

SUMMARY OF THE INVENTION

This invention provides a method of making phase-shifting masks in which no (precise) alignment steps are required. More specifically, in accordance with the invention, a phase-shifting mask is fabricated by a method including the steps of:

(a) providing a body comprising a patterned opaque layer located on a top major surface of an optically transparent substrate, and a resist layer located on the top surface of the body, the resist layer being negative tone with respect to first actinic radiation and positive tone with respect to second actinic radiation, the negative tone of the first actinic radiation dominating over the positive tone of the second actinic radiation, and the patterned opaque layer comprising at least first, second, and third successive portions that define a first gap region located and extending between the first and second portions and a second gap region located and extending between the second and third portions;

(b) directing a patterned beam of the first actinic radiation onto the top major surface of the resist layer, the patterned beam of the first actinic radiation filling the first gap region, but being absent everywhere in the second gap region, and the patterned beam having edges that do not coincide with edges of the patterned opaque layer;

(c) directing a flood beam of the second actinic radiation onto a bottom major surface of the substrate, the substrate being transparent with respect to the second actinic radiation, and the patterned opaque layer being opaque with respect to the second actinic radiation, whereby the flood beam is incident in those regions of the resist layer which do not overlie the patterned opaque layer;

(d) developing the resist layer, whereby the resist layer is removed in, and only in, those regions where the flood beam of the second actinic radiation was incident in the absence of the patterned beam's having been incident, and whereby other regions of the resist layer, including those regions that overlie the opaque layer and those regions that were exposed to the first actinic radiation, remain in place and form a patterned resist layer; and (e) subjecting the top surfaces of the patterned resist layer and of the body to anisotropic etching, whereby those portions of the transparent substrate that are not covered by the patterned resist layer are removed to a prescribed depth in the substrate.

As used herein, the term "actinic" refers to radiation to which the resist layer is sensitive—such as photons, typically ultraviolet (UV), and electron beam. Typically, the (patterned) first beam of actinic radiation is composed of electrons or deep UV, and the (flood) second beam of actinic radiation is flood mid-UV. For some resist layers the order of sequence of steps (b) and (c) can be reversed. Moreover, the same wavelength(s) can be used for the first and second beams in conjunction with resist layers that can be convened from one tone to the other tone by means of an intermediate step, such as hard-baking, between irradiations with the first (patterned) and second (flood) beams. After step (e) the remaining resist layer can be removed, and the resulting (mask) structure can then be used as the phase-shifting lithographic mask 103 in the optical lithographic fabrication system 200.

Because the (patterned) first beam dominates over the second beam of radiation (insofar as determining where the resist layer becomes negative tone), and because the patterned layer absorbs the flood beam of radiation and casts correspondingly patterned shadows in the resist layer (whereby development of the resist layer is suppressed in the regions of these shadows even where the (patterned) first beam was incident), the only alignment requirement for the (patterned) first beam is that its edges are located somewhere on the surface of the patterned opaque layer—i.e., are located away from the edges of the patterned opaque layer. Typically, the patterned opaque layer is metallic (such as chrome, viz., chromium), and the substrate is quartz.

The transparent portions of the phase-shifting masks produced by the technique of this invention can all be made from a single material in a single transparent substrate (integral body). That is, there is no need for an interface of the (quartz) substrate with a different transparent material: such an interface could give rise to unwanted optical reflections when the mask is used in the optical system 200, unless pains be taken to make the indices of refraction of the two different materials precisely equal. Moreover, there is no need for an extra step to deposit (or otherwise form a layer or region of) any such different transparent material.

DETAILED DESCRIPTION

Figure 2:
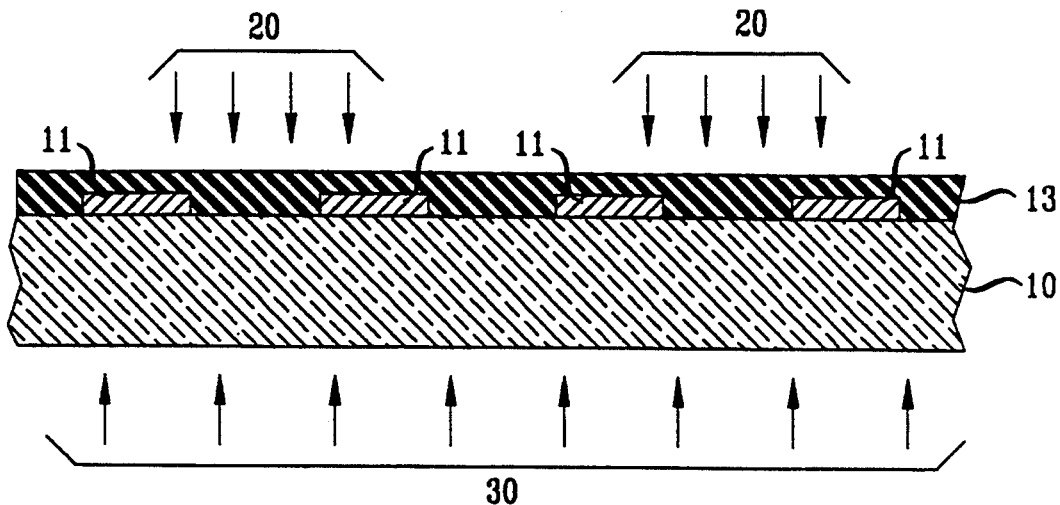
FIGS. 2 and 3 are cross-section elevational diagrams in various successive stages in the fabrication of a phase-shifting mask, which is useful in the system shown in FIG. 1, in accordance with a specific embodiment of the invention.

Referring now to FIG. 2, a patterned chrome layer 11 is located on the top surface of a quartz substrate 10. This patterned chrome layer 11, typically in the pattern of stripes running perpendicular to the plane of the drawing, has been formed earlier typically by depositing a uniform chrome layer (not shown) everywhere on the top surface of the quartz substrate 10 and patterning it by standard lithographic masking and etching. Then a resist layer 13 is formed—typically by a spinning-on procedure—both on the top surface of the patterned chrome layer 11 and on the exposed portions of the top surface of the substrate 10. The material of the resist layer 13 is selected such that a subsequent development will remove those portions and only those portions of the resist layer that have been exposed to ultraviolet radiation in the absence of exposure to an electron beam: that is, the resist layer is positive tone with respect to ultraviolet light and is negative tone with respect to an electron beam, with the electron beam dominating over the ultraviolet light. For example, the resist layer can be made of AZ 5206 resist supplied by Hoechst Celanese Corp. which requires an electron beam dose of 40 $\mu C/cm^2$ at 20 keV. In order to obtain the desired negative tone property with this resist, a post-exposure hard-baking is used, typically at 130° C. for 4 minutes.

The top surface of the resist layer 13 is bombarded with a patterned electron beam 20. The lateral edges of this patterned beam 20 are located somewhere in the midst of the patterned metallic chrome layer 11, i.e., not coincident with edges of the patterned chrome layer. Next, the bottom surface of the quartz substrate 10 is exposed to a flood ultraviolet (UV) beam 30 of parallel radiation, whereby the resist layer 13 is exposed to ultraviolet radiation only in regions that are not protected by the shadow cast by the patterned chrome layer 11. The resist layer 13 is then developed, for example, in the case of the resist AZ 5206, with a solution of ammonium hydroxide in water (normality of 0.27N) for one minute.

The flood beam 30 typically is of a wavelength in the mid-UV range of the electromagnetic spectrum, such as the mercury g-line (436 nm) or h-line (405 nm).

After the development of the resist layer 13, because of the above-described development properties of this resist layer 13, a (remaining) patterned resist layer 14 (FIG. 3) is obtained. Accurate alignment of the edges of this patterned resist layer 14 with respect to the edges of the patterned chrome layer 11 is thus achieved by virtue of the geometric shadow previously cast by the parallel ultraviolet beam 30 in the resist layer 13.

Figure 3:
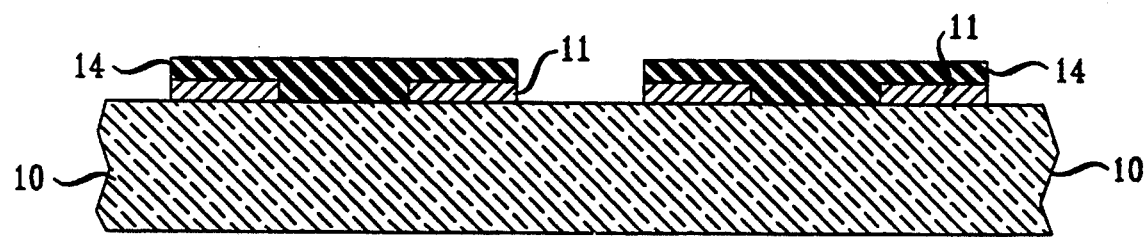

Next, the top surface of the structure shown in FIG. 3 is subjected to a dry plasma anisotropic etching, as known in the art, suitable for removing the thus exposed quartz of the substrate 10, but not the unexposed quartz (underlying the patterned resist layer 14). This etching is continued until indentations 15 are formed in the quartz substrate 10 to a desired depth, as can be controlled by etching time.

Figure 1:
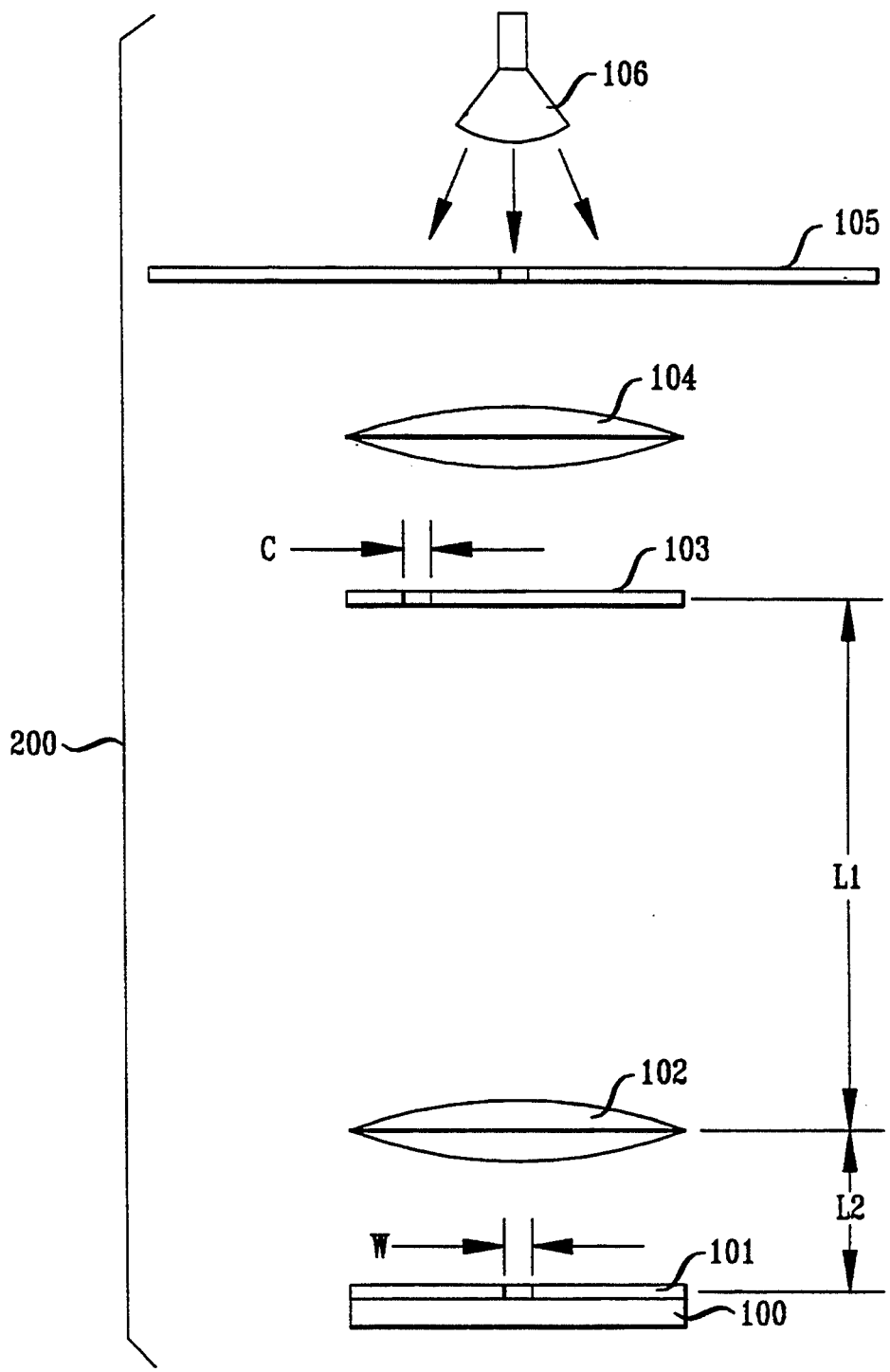
FIG. 1 shows a typical optical lithographic system for delineating features in a workpiece, in accordance with prior art.
Figure 4:
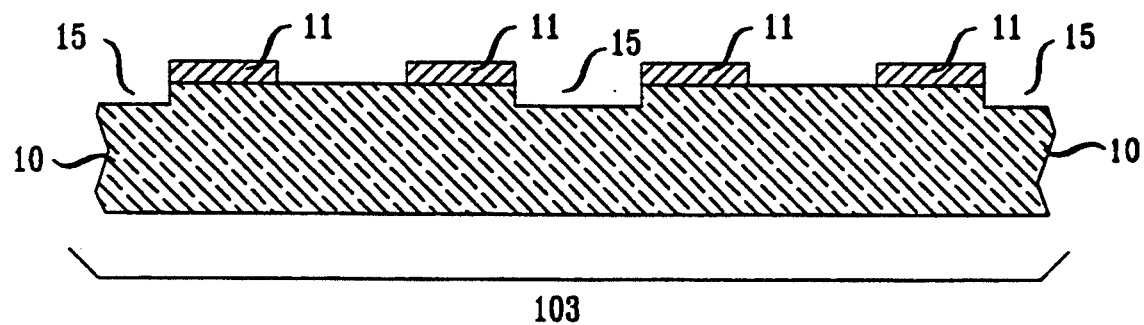
FIG. 4 is a cross-section elevational diagram of the phase-shifting mask that has been fabricated in accordance with the specific embodiment of the invention.

The patterned resist layer 14 is then removed, whereby the desired phase-shifting lithographic mask 103 shown in FIG. 4 is obtained. This mask can then be used as the mask or reticle 103 in the system 200 (FIG. 1).

Although the invention has been described in terms of a specific embodiment, various modifications can be made without departing from the scope of the invention. Instead of chrome, the patterned opaque layer 11 can be chromium oxide or a combination of chrome and chromium oxide. Alternatively, any optically absorbing material can be used for the patterned opaque layer 11.

Instead of using a patterned electron beam 20, a patterned deep ultraviolet (UV) beam—typically of a wavelength 248 nm or 193 nm (i.e., the wavelength emitted by krypton fluoride or argon fluoride excimer laser, respectively)—can be used in conjunction with the flood mid-UV beam 30 and a suitable resist layer 13: for example, a polymer, such as chlorinated polycresol formaldehyde, mixed in a suitable solvent (such as cellosolve acetate, diglyme, xylene, or butyl acetate) with a mid-UV sensitizer, such as substituted diazo naphthaquinone. In such a case, the resist layer should have the property of cross-linking wherever the (patterned) deep UV beam 20 was incident and thus becoming negative tone thereat with respect to the mid-UV beam, and also should have the property of being soluble in a suitable developing solution (such as a basic aqueous solution) wherever the resist is not cross-linked, i.e., wherever the deep UV beam 20 was not incident. The purpose of the mid-UV sensitizer is to enhance the positive tone property of the resist wherever the mid-UV beam 30 was incident thereon in the absence of the patterned deep UV beam. This resist and sensitizer can also be used in case the patterned beam 20 is electrons.

The order of sequence of exposure to patterned deep UV or patterned electrons and flood mid-UV can be reversed, and hard-baking of this resist is not needed whether the patterned beam is composed of electrons or deep UV radiation. Other resists that can similarly be used in conjunction with patterned deep UV or patterned electrons and flood mid-UV are mentioned in PCT patent application WO 90/1563 laid open Dec. 13, 1990.

Instead of using two different wavelengths for the patterned and flood beams, the same wavelengths can be used in conjunction with an intermediate step (such as hard-baking) that converts the resist layer from one tone to the other in those (and only those) regions where the resist layer was exposed to the patterned beam (prior to the flood beam exposure), with the regions of negative tone predominating over those of positive tone thereafter. For example, the (initially positive tone) resist AZ 5206 can first be irradiated with a patterned beam of mid-UV radiation, then hard-baked (at 130° C.), then irradiated with a flood beam of mid-UV radiation having the same wavelength as that of the patterned beam, and then developed.

We claim:

1. A method of making a phase-shifting mask including the steps of:

(a) providing a body comprising a patterned opaque layer located on a top major surface of an optically transparent substrate, and a resist layer located on the top surface of the body, the resist layer being negative tone with respect to first actinic radiation and positive tone with respect to second actinic radiation, the negative tone of the first actinic radiation dominating over the positive tone of the second actinic radiation, and the patterned opaque layer comprising at least first, second, and third successive portions that define a first gap region located and extending between the first and second portions and a second gap region located and extending between the second and third portions;

(b) directing a patterned beam of the first actinic radiation onto the top major surface of the resist layer, the patterned beam of the first actinic radiation filling the first gap region but being absent everywhere in the second gap region, and the patterned beam having edges that do not coincide with edges of the patterned opaque layer;

(c) directing a flood beam of the second actinic radiation onto a bottom major surface of the substrate, the substrate being transparent with respect to the second actinic radiation, and the patterned opaque layer being opaque with respect to the second actinic radiation, whereby the flood beam is incident in those regions of the resist layer which do not overlie the patterned opaque layer;

(d) developing the resist layer, whereby the resist layer is removed in, and only in, those regions where the flood beam of the second actinic radiation was incident in the absence of the patterned beam's having been incident, and whereby other regions of the resist layer, including those regions that overlie the opaque layer and those regions that were exposed to the first actinic radiation, remain in place and form a patterned resist layer; and (e) subjecting the top surfaces of the patterned resist layer and of the body to anisotropic etching, whereby those portions of the transparent substrate that are not covered by the patterned resist layer are removed to a prescribed depth in the substrate.

2. The method of claim 1 further including the step of removing the patterned resist layer after step (e) has been performed.

3. The method of claim 1 in which the flood beam of second actinic radiation is ultraviolet.

4. The method of claim 1 in which the patterned beam of first actinic radiation is a patterned beam of electrons.

5. The method of claim 1 in which the first and second actinic radiation is ultraviolet radiation of different first and second wavelengths, respectively.

6. The method of claim 1 in which the patterned beam is a beam of electrons and in which the flood beam is a beam of ultraviolet radiation.

7. The method of claim 1 in which the patterned opaque layer is a patterned metallic layer.

8. The method of claim 1 in which the patterned opaque layer is a patterned chromium layer.

9. The method of claim 1 in which the patterned beam of the first actinic radiation is incident on the resist layer in a first region thereof that overlaps and extends between a first pair of adjacent separated segments of the patterned opaque layer.

10. The method of claim 9 in which the patterned beam of the first actinic radiation is also incident on the resist layer in a second region thereof that overlaps and extends between a second pair of adjacent separated segments of the patterned opaque layer.

11. The method of claim 10 in which at least two separated segments of the patterned opaque layer intervene between the first and second pair of adjacent separated segments of the patterned opaque, and in which the patterned beam of the first actinic radiation is not incident on the resist layer anywhere between the first and second pair of separated segments.

12. A photolithographic method including the steps of:
   (a) forming a phase-shifting mask structure in accordance with the steps recited in claim 1, 2, 3, 4, 5, 6, 7, or 8;
   (b) directing optical radiation onto the mask, and focusing the radiation propagating through the mask structure onto a photoresist layer located on a major surface of a wafer, or on a layer of material located on a major surface of a wafer;
   (c) developing the photoresist layer, whereby an edge feature is formed therein; and
   (d) defining a feature at the major surface of the wafer or in the layer of material, respectively, in accordance with the edge feature in the photoresist layer.

13. A photolithographic method of making semiconductor integrated circuits including the steps of:
   (a) forming a phase-shifting lithographic mask structure in accordance with the steps recited in claim 1, 2, 3, 4, 5, 6, 7 or 8;
   (b) directing optical radiation onto the mask structure, and focusing the radiation propagating through the mask onto a photoresist layer located on a major surface of a semiconductor wafer or located on a layer of material located on a major surface of a semiconductor wafer;
   (c) developing the photoresist layer, whereby an edge feature is created therein;and
   (d) defining a feature at the major surface of the semiconductor wafer or in the layer of material, respectively, in accordance with the edge feature in the photoresist layer.

* * * * *